United States Patent
Maruyama et al.

(10) Patent No.: US 6,444,911 B2
(45) Date of Patent: Sep. 3, 2002

(54) BUS BAR WIRING PLATE BODY FOR ELECTRIC COUPLING BOX

(75) Inventors: Mitsuko Maruyama; Hidenori Yamanashi, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/822,521

(22) Filed: Apr. 2, 2001

(30) Foreign Application Priority Data

Mar. 31, 2000 (JP) ........................................ 2000-098501

(51) Int. Cl.[7] ................................................ H02G 3/16
(52) U.S. Cl. ...................................... 174/70 B; 439/736
(58) Field of Search ........................ 174/70 B; 439/949, 439/736, 76.2; 361/611

(56) References Cited

U.S. PATENT DOCUMENTS

| | | | | |
|---|---|---|---|---|
| 3,708,609 A | * | 1/1973 | Iosue et al. ................. | 174/72 B |
| 3,959,523 A | * | 5/1976 | Grunwald et al. ............ | 427/98 |
| 4,208,080 A | * | 6/1980 | Teagno ...................... | 339/18 B |
| 4,429,943 A | * | 2/1984 | Inoue ....................... | 339/198 R |
| 5,358,211 A | * | 10/1994 | Stewrett ..................... | 249/80 |
| 5,852,289 A | * | 12/1998 | Masahiko ................... | 235/492 |
| 5,889,320 A | * | 3/1999 | Phelps, Jr. et al. .......... | 257/698 |
| 6,116,916 A | * | 9/2000 | Kasai ........................ | 439/76.2 |
| 6,244,877 B1 | * | 6/2001 | Asao ......................... | 439/76.2 |
| 6,283,769 B1 | * | 9/2001 | Asao et al. ................. | 439/76.2 |

FOREIGN PATENT DOCUMENTS

JP  8-79936  3/1996  ............ H02G/3/16

OTHER PUBLICATIONS

Patent Abstracts of Japan 08–079936 Mar. 22, 1996.

* cited by examiner

*Primary Examiner*—Dean A. Reichard
*Assistant Examiner*—Jinhee J Lee
(74) *Attorney, Agent, or Firm*—Sughrue Mion, PLLC

(57) ABSTRACT

A bus wiring plate body (20), for an electric coupling box, is arranged in a manner that bus bar members (23, 24) are wired between pre-hardening epoxy resin plates (21, 22) and these pre-hardening epoxy resin plates are subjected to a heat pressing process to thereby integrate the pre-hardening epoxy resin plates (21, 22) and the bus bar members (23, 24) in a laminated state. When hardened epoxy resin plates (25, 26) are disposed outside of the pre- hardening epoxy resin plates (21, 22), respectively, the strength of the bus bar wiring plate body (20) can be improved. Thus, since the bus bar members (23, 24) are sealed in an insulated state, leak current is reduced. Further, the thickness of the bus bar wiring plate body (20) is reduced to a large extent, so that the electric coupling box can be miniaturized and lightweighted.

9 Claims, 7 Drawing Sheets

BUS BAR WIRING PLATE BODY FOR ELECTRIC COUPLING BOX

BACKGROUND OF THE INVENTION

1. Technical Field of the Invention

The present invention relates to a bus bar wiring plate body for an electric coupling box used for coupling an electric system within a vehicle such as an automobile etc. and, more particularly, relates to the configuration of a bus bar wiring plate body for an electric coupling box which increases the insulating resistance between bus bar members disposed within the electric coupling box to make it possible to improve and withstand voltage and reduce leak current.

2. Related Art

As shown in FIG. 7, a related electric coupling box such as a junction block (J/B), a relay box etc. used for electric wiring within a vehicle such as an automobile etc. is provided with a bus bar wiring plate 1 in which a plurality of bus bar members 3 wired along the surface of an insulating substrate 2 are formed in a manner that respective tab-shaped terminals 7 are protruded upwarded and downward from both opposite surfaces of the insulating substrate 2. The related electric coupling box is provided with a rear cover 4 for housing the bus bar wiring plate 1, a front cover 6 on which connector housings 6a to 6c are disposed as relays, a fuse, an electronic circuit unit etc. are protrusively provided, and a waterproof cover 9 capable of covering the front cover.

In particular, as shown in FIG. 8, the bus bar wiring plate 1 is arranged in a manner that, in order to wire the bus bar members 3 along the surface of the insulating substrate 2, respective ribs 2A for positioning and increasing the insulating resistance are protrusively provided among the respective bus bar members 3 on the insulating substrate 2.

However, according to the related bus bar wiring plate 1, as the power supply voltage (battery voltage) of a vehicle has been increased from 12V to 36V, the conventional ribs' 2A insulating resistance between the bus bar members 3 decreases, and so leak current flows. When this leak current flows, there arise problems in that a failure caused by signal leakage may occur, and that an unexpected failure likely occurs due to the carbonization of the insulating substrate 2 caused by the heat.

In order to eliminate such problems, such countermeasures are considered that the transversal width of each of the ribs 2A is made larger as shown in FIG. 9 or that the height of each of the ribs 2A is made higher as shown in FIG. 10. However, each of such countermeasures has a problem that the size of the electric coupling box itself becomes larger and the packaging density within the electric coupling box reduces.

Further, although the bus bar members 3 are wired within groove portions formed by the respective ribs 2A on the surface of the insulating substrate 2, since both the bus bar members and the ribs are hard, it is difficult to fit the bus bar members 3 within the groove portions in a firmly fitting state. Thus, there arises a problem that when the bus bar members 3 are not engaged by a particular engagement means, the close adhesion between both the bus bar members and the ribs can not be guaranteed and so abnormal sound such as rattling sound is generated due to the loose fitting state of the bus bar members 3.

Further, as shown in FIG. 11, generally, the bus bar wiring plate 1 is formed by laminating the insulating substrates 2 and the bus bar members 3 in plural stages. An insulating member 5 made of rubber etc. is sandwiched between the insulating substrate 2 of the upper layer and the insulating substrate 2 of the lower layer to press the bus bar members 3 of the lower layer through the insulating member 5, whereby the rattling phenomenon can be prevented and the insulating properties can be improved.

However, the bus bar wiring plate 1 can not be miniaturized nor lightened and further is limited in the improvement of the withstand voltage.

SUMMARY OF THE INVENTION

The invention is intended to eliminate the aforesaid problem of the conventional technique, and an object of the invention is to provide a bus bar wiring plate body for an electric coupling box which can improve insulating properties between bus bar members to prevent the generation of a leak current and also can miniaturize the size thereof.

To achieve the aforesaid object, there is provided a bus bar wiring plate body for an electric coupling box comprising:
- a pair of pre-hardening epoxy resin plates with soft property having through holes; and
- a plurality of bus bar members wired between the pair of pre-hardening epoxy resin plates, which respectively have tab shaped terminals protruding therefrom and passed through the through holes,
- wherein the pair of pre-hardening epoxy resin plates and the plurality of bus bar members are heated and hardened to integrate the plurality of bus bar members in an electrically insulated state.

According to the bus bar wiring plate body for the electric coupling box thus configured, since the respective bus bar members are heated and hardened in a state being sandwiched between the respective pre-hardening epoxy resin plates, a single bus bar wiring plate body can be formed without providing a supporting plate etc. At the time of the heat pressing operation, the pre-hardening epoxy resin plates become fluid between the respective pre-hardening epoxy resin plates and also flow into engagement holes etc. formed at the respective bus bar members and thereafter heated and hardened. Thus, the rattling phenomenon of the respective bus bar members can be prevented and the insulating properties thereof can be improved, so that the leak current can be reduced and the bus bar wiring plate body can be miniaturized and light-weighted. that, preferably, the bus bar wiring plate body for an electric coupling box is characterized in that hardened epoxy resin plates with hard properties are laminated on the respective pre-hardening epoxy resin plates from outsides thereof, respectively, and heated and hardened to thereby integrate the respective pre-hardening epoxy resin plates, the respective bus bar members and the respective hardened epoxy resin plates.

According to the bus bar wiring plate body for the electric coupling box thus configured, since the insulation etc. of the respective bus bar members is covered by the respective hardened epoxy resin plates, the bus bar wiring plate body can be entirely enhanced in its strength.

Furthermore, the aforesaid problems can be obviated in a manner that, preferably, the bus bar wiring plate body for an electric coupling box is characterized in that a printed circuit board with hard property is laminated on at least one of the pre-hardening epoxy resin plates from outsides thereof and heated and hardened to thereby integrate the respective bus bar members and a circuit pattern formed on the printed circuit board in an insulated state.

According to the bus bar wiring plate body for the electric coupling box thus configured, since the circuit pattern is laminated on the respective bus bar members, the packaging density of the bus bar wiring plate body can be improved.

Furthermore, the aforesaid problems can be obviated in a manner that, preferably, the bus bar wiring plate body for an electric coupling box is characterized in that the tab shaped terminals formed by electing one end of the bus bar members are coupled to predetermined positions of the circuit pattern formed on the printed circuit board, respectively..

According to the bus bar wiring plate body for the electric coupling box thus configured, since the bus bar members are coupled to the circuit pattern formed on the printed circuit board, the bus bar wiring plate body can be made multi-functional.

Furthermore, the aforesaid problems can be obviated in a manner that, preferably, the bus bar wiring plate body for an electric coupling box is characterized in that the tab shaped terminals formed by electing one end of the bus bar members are respectively protruded as external coupling terminals through the through holes formed at least in the pre-hardening epoxy resin plate, and possibly also in the hardened epoxy resin plate.

The aforesaid object can also be achieved by a method of manufacturing a bus bar wiring plate body for an electric coupling box, said method comprising the steps of:

wiring a plurality of bus bar members between a pair of pre-hardening epoxy resin plates with soft properties; and heating and hardening the plurality of bus bar members and the pair of pre-hardening epoxy resin plates to integrate the plurality of bus bar members in an electrically insulated state.

Regarding the above method, preferably, in said wiring step, a gap is formed between the plurality of bus bar members and the pair of pre-hardening epoxy resin plates.

Regarding the above method, preferably, the pair of pre-hardening epoxy resin plates are pressed toward the plurality of bus bar members during said heating and hardening step.

Regarding the above method, preferably, the method of manufacturing the bus bar wiring plate body further comprising, between said wiring step and said heating and hardening step, the step of:

disposing a pair of hardened epoxy resin plates so as to put the pair of pre-hardening epoxy resin plates therebetween.

DESCRIPTION OF PREFERRED EMBODIMENT

Figure 1:
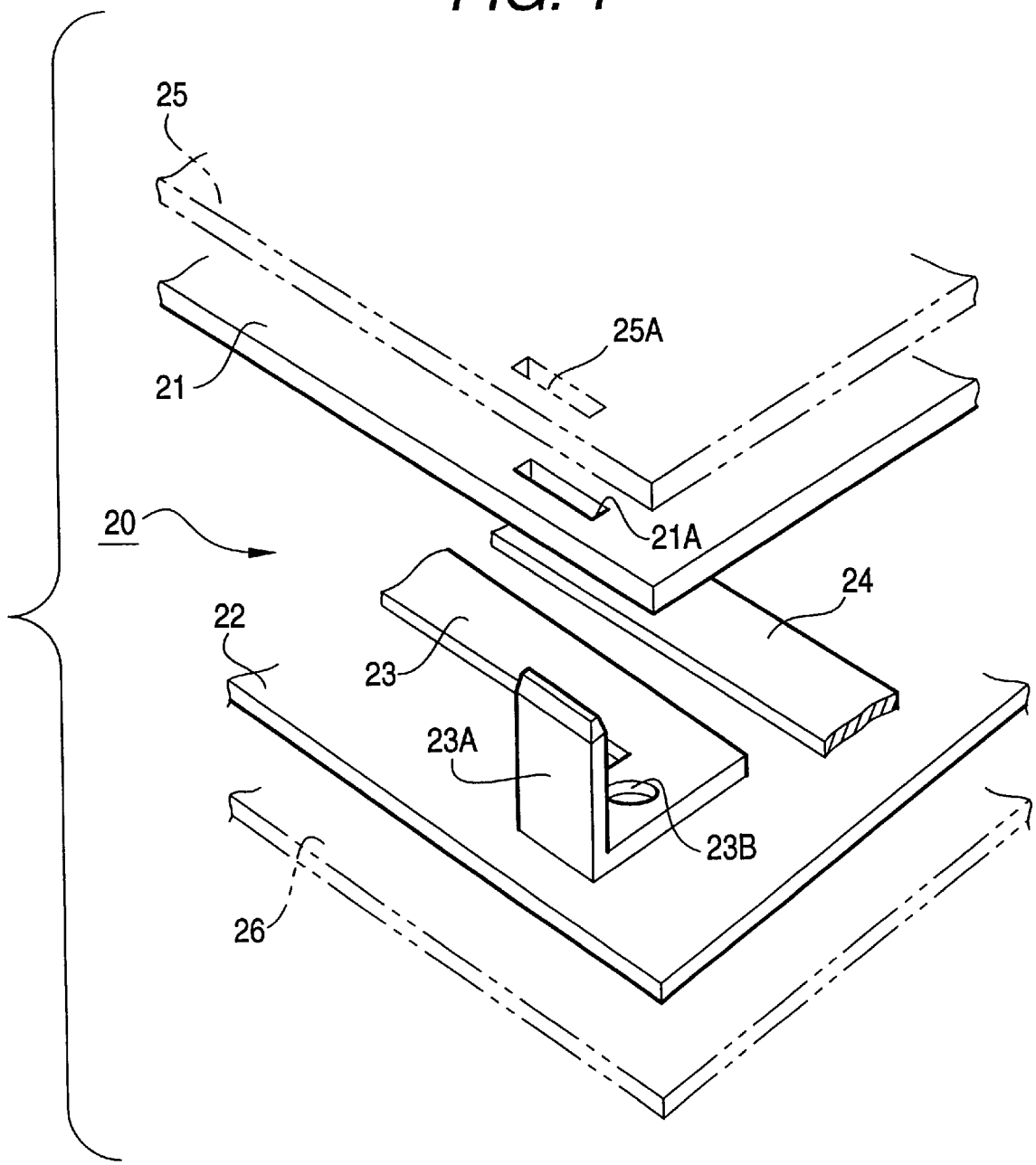
FIG. 1 is an exploded perspective view showing the bus bar wiring plate body for an electric coupling box according to an embodiment of the present invention.
Figure 2:
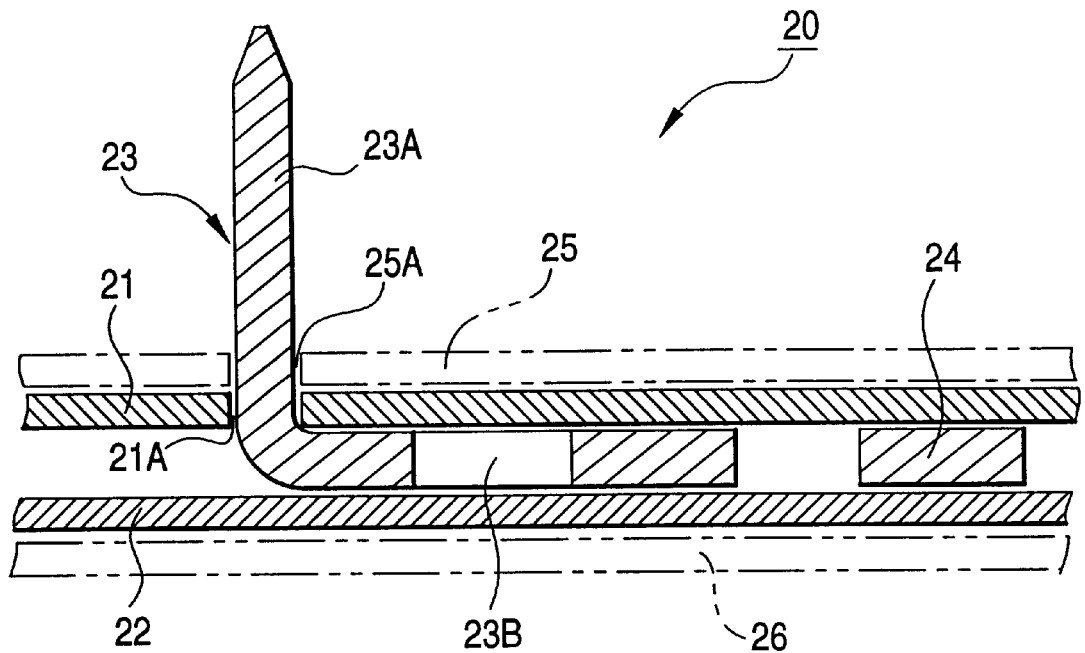
FIG. 2 is a sectional view showing a state where the bus bar wiring plate body of FIG. 1 has not been laminated yet.
Figure 3:
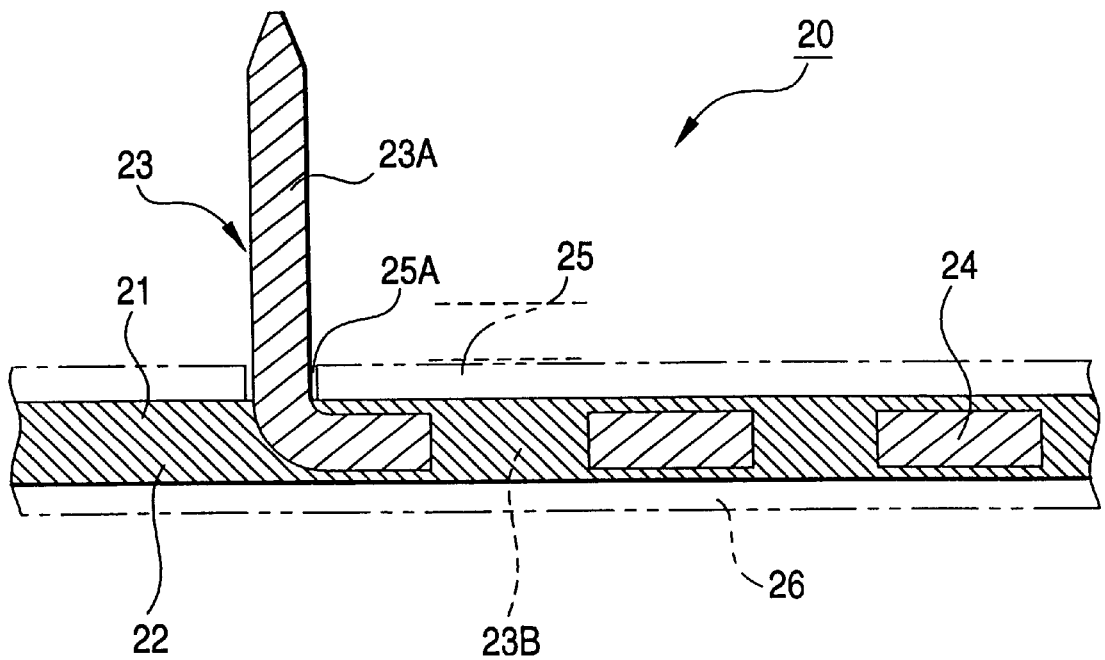
FIG. 3 is a sectional view showing a state where the bus bar wiring plate body of FIG. 2 has been laminated.

The bus bar wiring plate body for an electric coupling box according to an embodiment of the invention will be explained in detail with reference to FIGS. 1 to 3. FIG. 1 is an exploded perspective view showing the bus bar wiring plate body for an electric coupling box according to the embodiment. FIG. 2 is a sectional view showing a state where the bus bar wiring plate body of FIG. 1 has not been laminated yet. FIG. 3 is a sectional view showing a state where the bus bar wiring plate body of FIG. 2 has been laminated.

As shown in FIG. 1, a bus bar wiring plate body 20 for the electric coupling box according to the embodiment is arranged in a manner that bus bar members 23, 24 wired along a predetermined circuit are putted between two pre-hardening epoxy resin plates 21, 22 with soft properties which are disposed at upper and lower positions, respectively. Thus, when the bus bar wiring plate body is subjected to the heat pressing procedure in the not entirely laminated state shown in FIG. 2, the bus bar wiring plate body 20 integrated as shown in FIG. 3 can be obtained.

In this respect, the one bus bar member 23 is provided with a tab shaped terminal 23A formed by electing the one end thereof and an engagement hole 23B opened in a circular shape. The other bus bar member 24 is formed in a belt shape. Each of the bus bar members 23, 24 can be changed suitably in its number, shape and position etc. of the wiring. Members shown by phantom lines in FIGS. 1 to 3 will be described later as a modified example of the embodiment.

The pre-hardening epoxy resin plates 21, 22 are ones generally used for general printed circuit boards (PCBs) . In this embodiment, the pre-hardening epoxy resin plates are temporarily formed as thin-film shaped thermoset epoxy resin plates in a non-hardened state, that is, in a state before the hardening reaction. After the hardening process, the pre-hardening epoxy resin plates 21, 22 are formed as hardened epoxy resin plates which are excellent in heat resisting properties. Thus, the bus bar wiring plate body 20 is suitable for use in the vicinity of an engine room etc.

Each of the bus bar members 23, 24 is formed by bending a belt-shaped conductive metal plate and generally used shapes may be used as the bus bar members.

In the case of constituting the bus bar wiring plate body 20 by assembling the respective members and plates, as shown in FIG. 2, the tab shaped terminal 23A provided at the one bus bar member 23 is passed through a through hole 21A formed at the pre-hardening epoxy resin plate 21 in the upper position. Then, the pre-hardening epoxy resin plate 21 at the upper position, the bus bar members 23, 24 wired in a parallel state, and the pre-hardening epoxy resin plate 22 at the lower side are assembled in a laminated state.

In this respect, in FIG. 2, the pre-hardening epoxy resin plates 21, 22 and the bus bar members 23, 24 are not integrated yet, and there remains small gaps between the epoxy resin plates and the bus bar members.

As shown in FIG. 2, after the bus bar members 23, 24 and the pre-hardening epoxy resin plates 21, 22 are put in the state that the bus bar members are between the pre-hardening epoxy resin plates, the heat pressing process is performed such that these laminated members and plates are heated and applied with pressure from the upper and lower direction. At the time of performing the heat pressing operation, a heat press machine (not shown) is employed in which a terminal run off portion for passing the tab shaped terminal 23A therethrough is formed at elastic material such as rubber etc. About 140° C., for example, is suitable as the heat temperature.

When the aforesaid heat pressing process is performed, the pre-hardening epoxy resin plates 21, 22 at the upper and lower positions become fluid and are pressed inside, so that the epoxy resin plates flow into the engagement hole 23B provided at the bus bar member 23 and the gaps etc. between the bus bar members 23, 24 so as to fill them, and thereafter hardened entirely. Thus, the pre-hardening epoxy resin plates 21, 22 are transmuted into hardened epoxy resin plates, respectively, and integrated with the bus bar members 23, 24 to thereby form the bus bar wiring plate body 20 shown in FIG. 3.

The aforesaid bus bar wiring plate body 20 is left as it is for 24 hours within the atmosphere with the temperature of 60° C. and the relative humidity of 95%, and thereafter a leak current is measured. As a result of the measurement, the leak current between the respective bus bar members 23 and 24 was always 0.1 mmA or less.

Since the hardened pre-hardening epoxy resin plates 21, 22 have high insulating properties as having been used as the printed circuit boards (PCBs), the bus bar wiring plate body according to the embodiment does not require leak-prevention ribs for the bus bar members which was required in the related bus bar wiring plate. Thus, the thickness of the bus bar wiring plate body 20 can be reduced to a large extent and so the electric coupling box can be miniaturized and light-weighted.

The configuration of the bus bar wiring plate body 20 for the electric coupling box according to the embodiment is not limited to the aforesaid configuration and can be modified suitably. For example, as shown in FIG. 1, a hardened epoxy resin plate 25 may be disposed above the pre-hardening epoxy resin plate 21 located in the upper position as shown by the phantom line and a hardened epoxy resin plate 26 may be disposed below the pre-hardening epoxy resin plate 22 located in the lower position as shown by the phantom line.

Then, these plates and members are laminated as shown by the phantom lines in FIG. 2 and subjected to the heat pressing operation. Thus, as shown in FIG. 3, the hardened epoxy resin plates 25, 26 are laminated above and below the bus bar wiring plate body 20, respectively, so that the strength of the bus bar wiring plate body 20 can be improved. Incidentally, the hardened epoxy resin plate 25 is also provided with a through hole 25A so that the tab shaped terminal 23A is passed therethrough at the time of the lamination.

Figure 4:
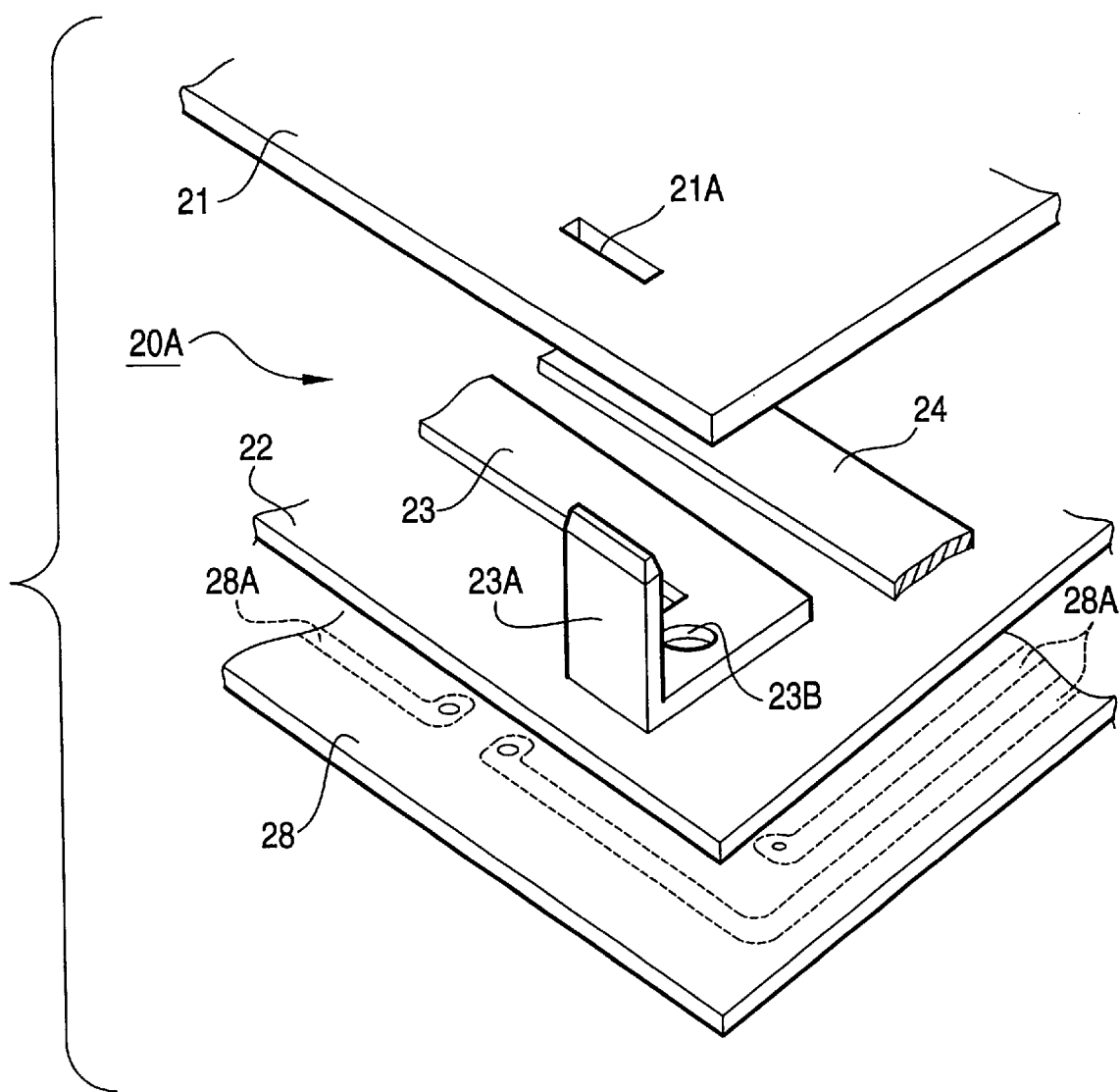
FIG. 4 is an exploded perspective view showing the bus bar wiring plate body for an electric coupling box according to another embodiment of the present invention.
Figure 5:
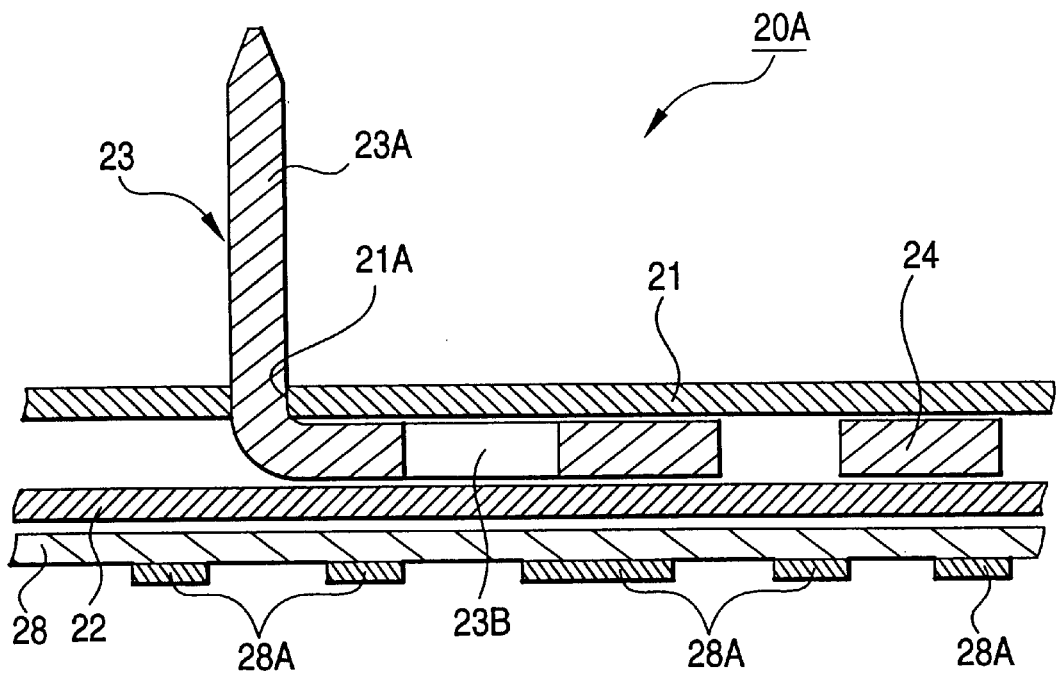
FIG. 5 is a sectional view showing a state where the bus bar wiring plate body of FIG. 4 has not been laminated yet.
Figure 6:
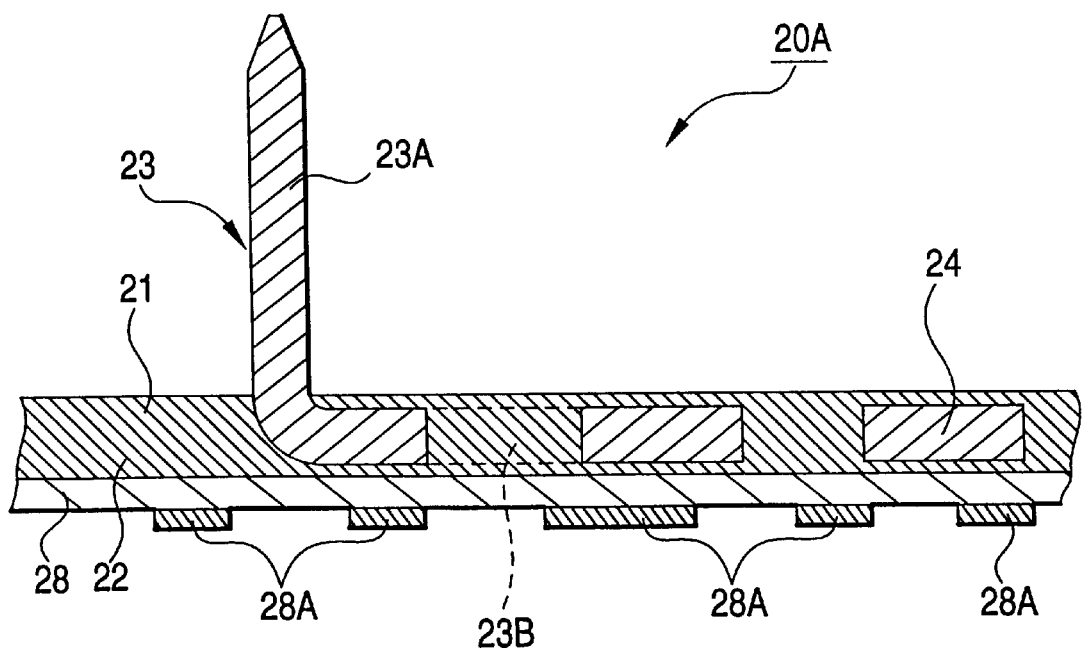
FIG. 6 is a sectional view showing a state where the bus bar wiring plate body of FIG. 5 has been laminated.
Figure 7:
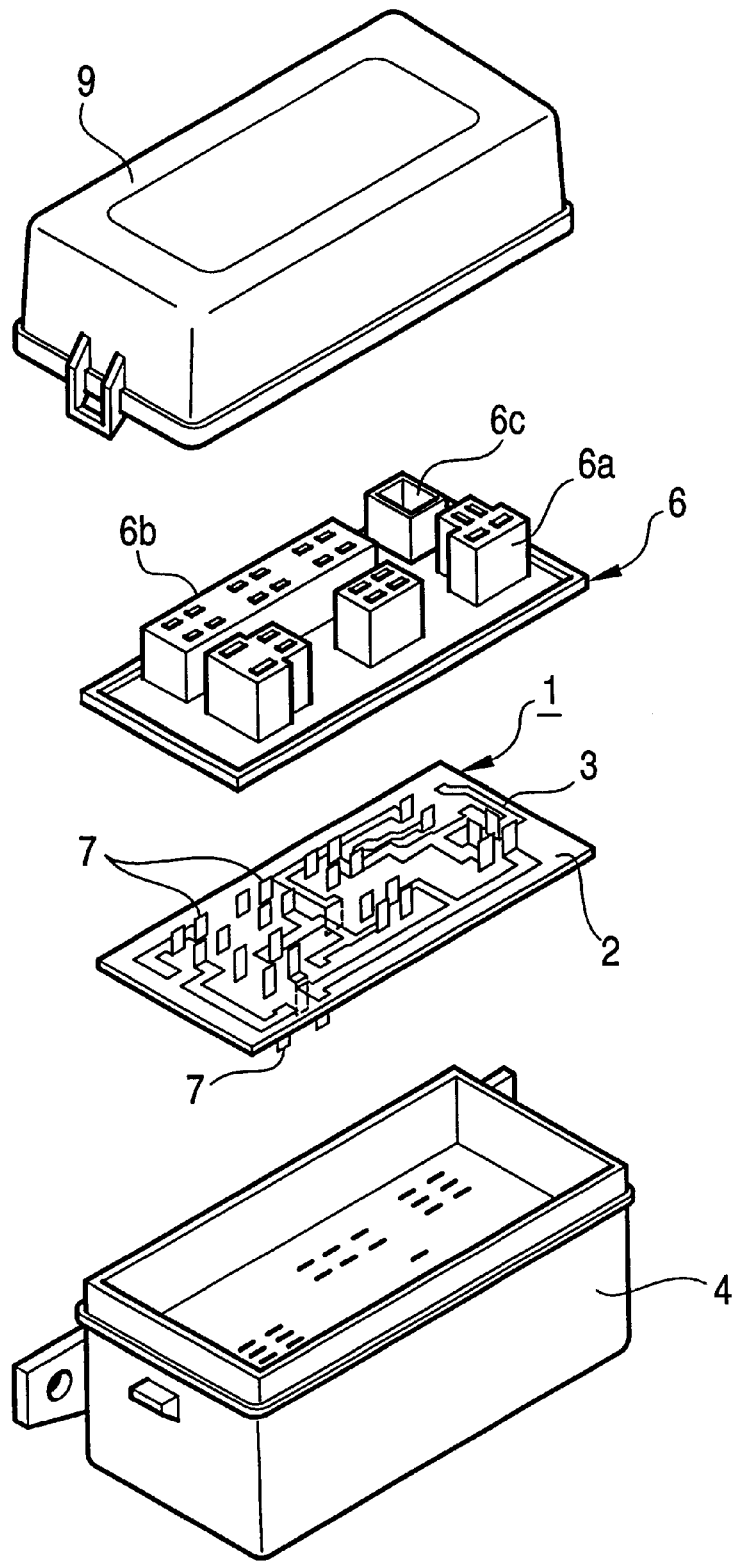
FIG. 7 is an exploded perspective view showing the main portion of a conventional electric coupling box.
Figure 8:
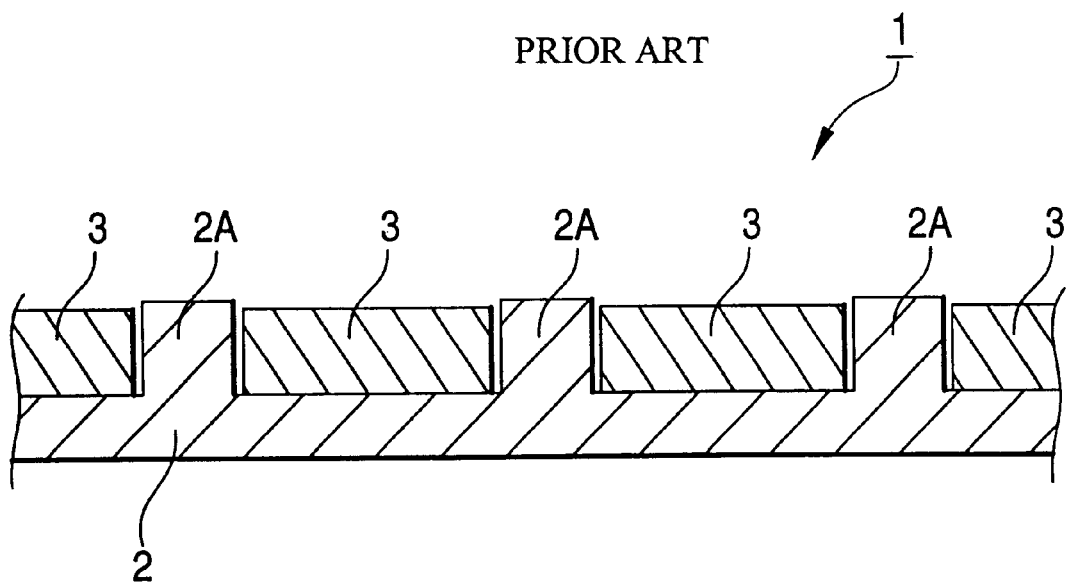
FIG. 8 is a sectional view showing the main portion of a related bus bar wiring plate body.
Figure 9:
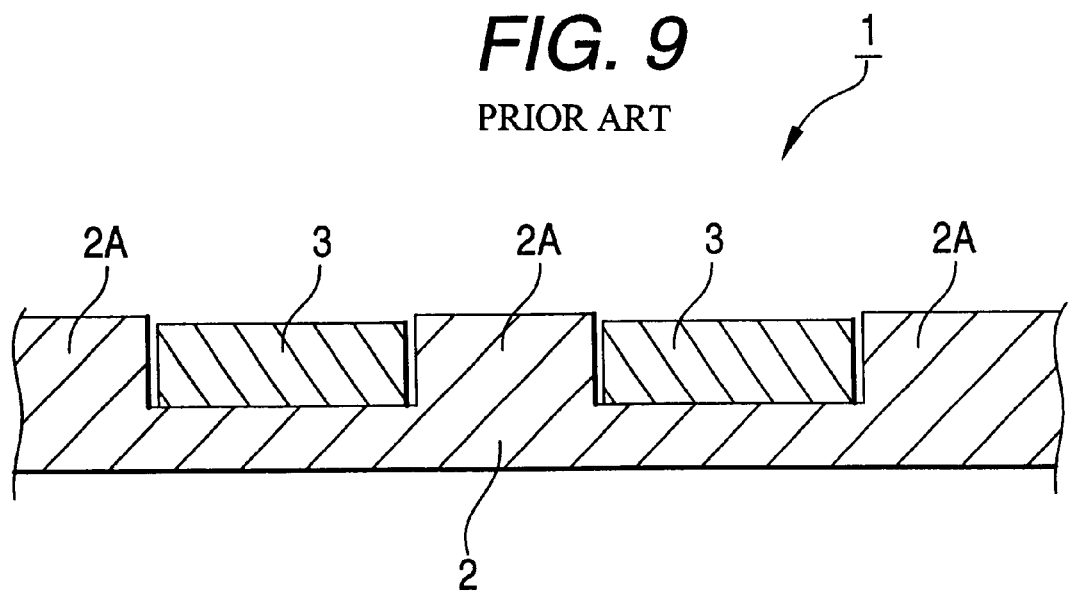
FIG. 9 is a sectional view showing the main portion of another related bus bar wiring plate body.
Figure 10:
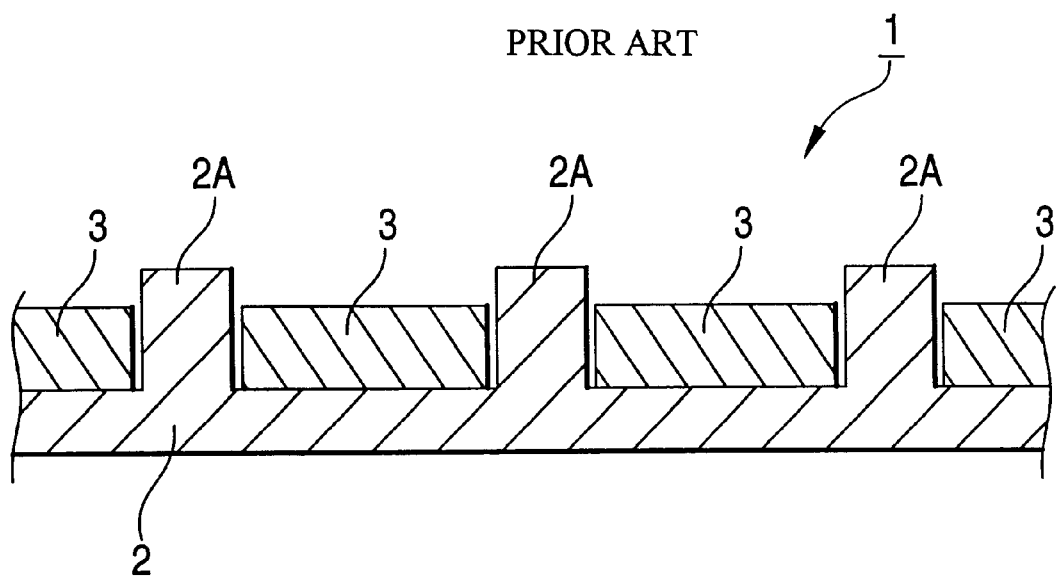
FIG. 10 is a sectional view showing the main portion of a still another related bus bar wiring plate body.
Figure 11:
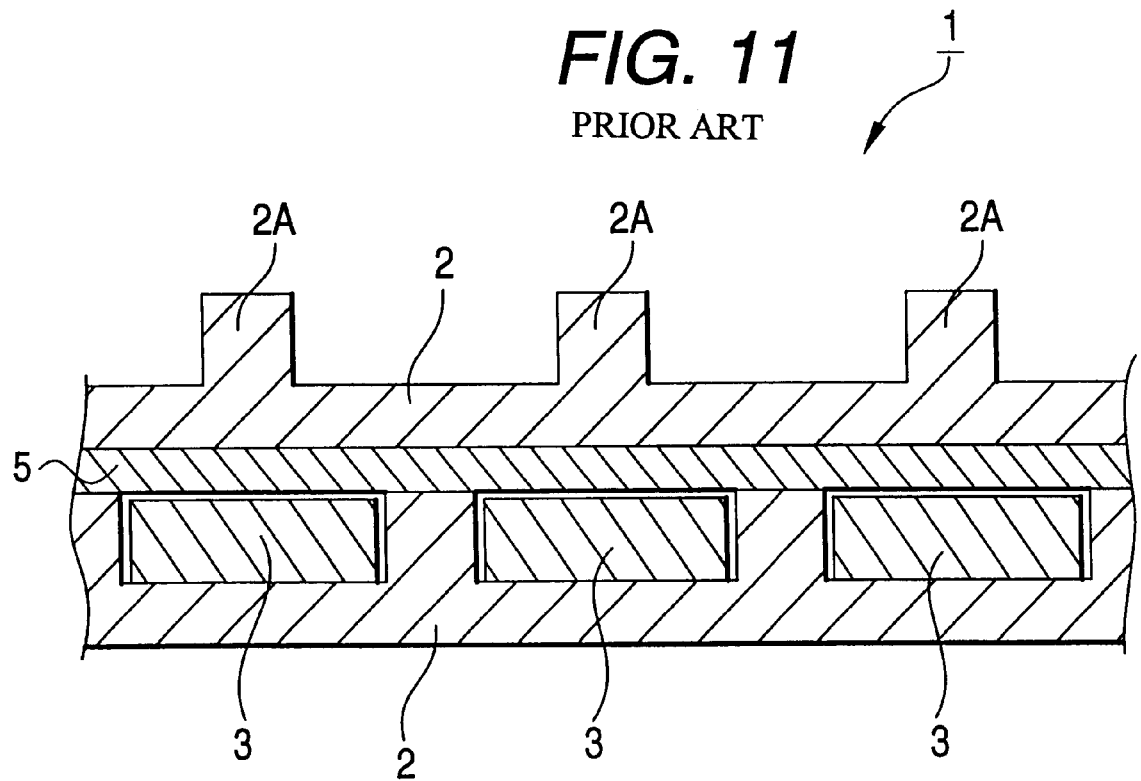
FIG. 11 is a sectional view showing the main portion of a related bus bar wiring plate body in a laminated state

The bus bar wiring plate body for an electric coupling box according to another embodiment of the invention will be explained in detail with reference to FIGS. 4 to 6. FIG. 4 is an exploded perspective view showing the bus bar wiring plate body for an electric coupling box according to the another embodiment. FIG. 5 is a sectional view showing a state where the bus bar wiring plate body of FIG. 4 has not been laminated yet. FIG. 6 is a sectional view showing a state where the bus bar wiring plate body of FIG. 5 has been laminated. Although this embodiment differs from the afore- said embodiment in a point that a print circuit board (PCB) is laminated so as to improve the packaging density, like parts corresponding to those of the aforesaid embodiment are marked with the same references and therefore the explanation thereof is omitted.

As shown in FIG. 4, the bus bar wiring plate body 20A for the electric coupling box according to the embodiment is formed by sequentially laminating from the upper direction in this figure a pre-hardening epoxy resin plate 21, bus bar members 23, 24, a pre-hardening epoxy resin plate 22 and a printed circuit board 28. The printed circuit board 28 is disposed so as to oppose the pre-hardening epoxy resin plate 22 in manner that the surface of the printed circuit board, on which a circuit pattern 28A shown by a broken line is formed, is directed downward.

In the case of constituting the bus bar wiring plate body 20A by assembling the respective members, plates and board, as shown in FIG. 5, the tab shaped terminal 23A provided at the bus bar member 23 is passed through a through hole 21A formed at the pre-hardening epoxy resin plate 21 in the upper position. Then, the pre-hardening epoxy resin plate 21 at the upper position, the bus bar members 23, 24 wired in a parallel state, the pre-hardening epoxy resin plate 22 at the lower direction and the printed circuit board 28 are placed in a state just before the lamination. In this respect, the respective members, plates and board are in the state just before the lamination, and there remains small gaps there among.

Then, the heat pressing process is performed such that these laminated members, plates and board are heated and applied with pressure from the upper and lower direction. At the time of performing the heat pressing operation, like the aforesaid embodiment, a heat press machine (not shown) is employed in which a terminal run off portion for passing the tab shaped terminal 23A therethrough is formed at elastic material such as rubber etc. About 140° C., for example, is suitable as the heat temperature.

When the aforesaid heat pressing process is performed, the pre-hardening epoxy resin plates 21, 22 at the upper and lower positions become fluid an flow while being pressed inside into an engagement hole 23B provided at the bus bar member 23 and the gaps etc. between the bus bar members 23, 24 so as to fill them, and thereafter the pre-hardening epoxy resin plates 21, 22 at the upper and lower portions are hardened entirely.

Thus, as shown in FIG. 6, the pre-hardening epoxy resin plates 21, 22 at the upper and lower portions, the bus bar members 23, 24 and the printed circuit board 28 are integrated and hardened in the laminated state to thereby form the bus bar wiring plate body 20A.

According to the bus bar wiring plate body 20A for the electric coupling box according to this embodiment, since the circuit pattern 28A as well as the bus bar members 23, 24 is laminated, the packing density of the bus bar wiring plate body 20A can be improved. Further, this embodiment can attain the same effects as the aforesaid embodiment with respect to the improvement of the waterproof and insulating functions and it becomes possible to miniaturize the bus bar wiring plate body 20A, so that the electric coupling box to which the bus bar wiring plate body 20A is applied can be miniaturized, light-weighted and multifunctional.

The configuration of the bus bar wiring plate body 20A for the electric coupling box according to the embodiment is not limited to the aforesaid configuration and can be modified suitably. For example, another printed circuit board may be laminated at the upper portion of the pre-hardening epoxy resin plate 21 in a manner that a circuit pattern of the circuit board is directed upward. In this case, the circuit patterns are laminated in an insulated state above and below the bus bar members 23, 24.

According to this configuration, for example, the tab shaped terminal 23A of the bus bar member 23 and the circuit patterns can be coupled by means of the soldering process etc. Further, the coupling between the bus bar members 23, 24 and the circuit patterns and the coupling between the circuit patterns of the upper and lower circuit boards can be performed by forming through holes.

Furthermore, a pre-hardening epoxy resin plate and a printed circuit board may be further laminated below the printed circuit board 28. Alternatively, the aforesaid hardened epoxy resin plates may be laminated at the uppermost and lowermost portions of the bus bar wiring plate body to thereby improve the entire strength thereof.

As described above, according to the bus bar wiring plate body for the electric coupling box of the invention, the respective bus bar members are wired between the plurality of pre-hardening epoxy resin plates with soft properties, and the respective pre-hardening epoxy resin plates and the respective bus bar members are heated and hardened to thereby integrate the respective bus bar members in the electrically insulated state .

Thus, since the respective bus bar members are heated and hardened in a state being sandwiched between the respective pre-hardening epoxy resin plates, the pre-hardening epoxy resin plates become fluid between the respective pre-hardening epoxy resin plates and flow into the gaps between the respective bus bar members and thereafter are hardened. Thus, without providing a supporting plate etc., the rattling phenomenon of the respective bus bar members can be prevented and the insulating properties thereof can be improved, so that the leak current can be reduced and the bus bar wiring plate body can be miniaturized and light-weighted.

Further, in the bus bar wiring plate body for an electric coupling box, the hardened epoxy resin plates with hard properties are laminated on the respective pre-hardening epoxy resin plates from outsides thereof, respectively, and heated and hardened to thereby integrate the respective pre-hardening epoxy resin plates, the respective bus bar members and the respective hardened epoxy resin plates.

According to the bus bar wiring plate body for the electric coupling box thus configured, since the insulation etc. of the respective bus bar members is covered by the respective hardened epoxy resin plates, the bus bar wiring plate body can be entirely enhanced in its strength.

Further, in the bus bar wiring plate body for an electric coupling box, the printed circuit board with hard property is laminated on at least one of the pre-hardening epoxy resin plates from the outside thereof and heated and hardened to thereby integrate the respective bus bar members and the circuit pattern formed on the printed circuit board in an insulated state.

Thus, since the circuit pattern is laminated on the respective bus bar members, the packaging density of the bus bar wiring plate body can be improved.

Furthermore, in the bus bar wiring plate body for an electric coupling box, the tab shaped terminals formed by electing one ends of the bus bar members are coupled to the predetermined positions of the circuit pattern formed on the printed circuit board, respectively.

Thus, since the bus bar members are coupled to the circuit pattern formed on the printed circuit board, the bus bar wiring plate body can be made multifunctional.

Furthermore, in the bus bar wiring plate body for an electric coupling box, the tab shaped terminals formed by electing one end of the bus bar members are respectively protruded as the external coupling terminals through the through holes formed at least in the pre-hardening epoxy resin plate and also in the hardened epoxy resin plate when such is used.

Thus, since the respective bus bar members serve as the external coupling terminals, the bus bar wiring plate body can be made multifunctional.

What is claimed is:

1. A bus bar wiring plate body for an electric coupling box comprising:

a pair of pre-hardening epoxy resin plates with soft property having through holes; and a plurality of bus bar members wired between the pair of pre-hardening epoxy resin plates, which respectively have tab shaped terminals protruding therefrom and passed through the through holes, wherein the pair of pre-hardening epoxy resin plates and the plurality of bus bar members are heated and hardened to integrate the plurality of bus bar members in an electrically insulated state.

2. The bus bar wiring plate body according to claim 1 further comprising:

a pair of hardened epoxy resin plates with hard properties laminated on the pair of pre- hardening epoxy resin plates from outsides thereof, wherein the pair of pre-hardening epoxy resin plates, the plurality of bus bar members and the pair of hardened epoxy resin plates are heated so as to integrate with each other and so that the pair of pre-hardening epoxy resin plates are hardened.

3. The bus bar wiring plate body according to claim 1, wherein the tab shaped terminals are respectively protruded as external coupling terminals through the through holes.

4. The bus bar wiring plate body according to claim 1 further comprising:

at least one printed circuit board with hard property forming a circuit pattern is laminated on at least one of the pre-hardening epoxy resin plates from outside thereof, wherein the pair of pre-hardening epoxy resin plates, the plurality of bus bar members and the at least one printed circuit board are heated so as to integrate with each other and become the plurality of bus bar members and the circuit pattern in an insulated state, and so that the pair of pre-hardening plates are hardened.

5. The bus bar wiring plate body according to claim 4, wherein the tab shaped terminals are coupled to predetermined positions of the circuit pattern.

6. A method of manufacturing a bus bar wiring plate body for an electric coupling box, said method comprising the steps of:

wiring a plurality of bus bar members between a pair of pre-hardening epoxy resin plates with soft properties; and heating and hardening the plurality of bus bar members and the pair of pre-hardening epoxy resin plates to integrate the plurality of bus bar members in an electrically insulated state.

7. The method of manufacturing the bus bar wiring plate body according to claim 6, wherein in said wiring step, a gap is formed between the plurality of bus bar members and the pair of pre-hardening epoxy resin plates.

8. The method of manufacturing the bus bar wiring plate body according to claim 6, wherein the pair of pre-hardening epoxy resin plates are pressed toward the plurality of bus bar members during said heating and hardening step.

9. The method of manufacturing the bus bar wiring plate body according to claim 6 further comprising, between said wiring step and said heating and hardening step, the step of:

disposing a pair of hardened epoxy resin plates so as to put the pair of pre-hardening epoxy resin plates therebetween.

* * * * *